United States Patent
Lee et al.

(10) Patent No.: US 9,534,839 B2
(45) Date of Patent: Jan. 3, 2017

(54) APPARATUS AND METHODS FOR TREATING A SUBSTRATE

(71) Applicant: Samsung Electronics Co., Ltd., Suwon-si (KR)

(72) Inventors: Hyosan Lee, Suwon-si (KR); Yongsun Ko, Suwon-si (KR); Kyongseob Kim, Suwon-si (KR); Kwangsu Kim, Seoul (KR); SeokHoon Kim, Seongnam-si (KR); Kuntack Lee, Suwon-si (KR); Yongmyung Jun, Hwaseong-si (KR); Yong-Jhin Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 740 days.

(21) Appl. No.: 13/707,253

(22) Filed: Dec. 6, 2012

(65) Prior Publication Data

US 2013/0145640 A1 Jun. 13, 2013

(30) Foreign Application Priority Data

Dec. 7, 2011 (KR) .................. 10-2011-0130385

(51) Int. Cl.
*F26B 5/04* (2006.01)
*H01L 21/67* (2006.01)

(52) U.S. Cl.
CPC ............. *F26B 5/04* (2013.01); *H01L 21/6715* (2013.01); *H01L 21/67051* (2013.01)

(58) Field of Classification Search
CPC . B01F 2005/0025; F26B 21/00; F26B 21/004; F26B 21/14
USPC ........................................................ 34/201
See application file for complete search history.

(56) References Cited

U.S. PATENT DOCUMENTS

| | | | | |
|---|---|---|---|---|
| 493,467 | A * | 3/1893 | Baker | F26B 9/06 34/231 |
| 1,228,283 | A * | 5/1917 | Beckworth et al. | B29B 13/06 34/193 |
| 1,327,313 | A * | 1/1920 | Cunliffe | F26B 21/004 34/214 |
| 1,327,314 | A * | 1/1920 | Cunliffe | B05D 3/04 118/58 |
| 1,412,598 | A * | 4/1922 | Ayres | F26B 21/00 34/225 |
| 1,667,512 | A * | 4/1928 | Cruikshank | A24B 1/02 126/58 |

(Continued)

FOREIGN PATENT DOCUMENTS

| | | |
|---|---|---|
| JP | 2001-324263 | 11/2001 |
| JP | 2004-311507 | 11/2004 |

(Continued)

*Primary Examiner* — Kenneth Rinehart
*Assistant Examiner* — Logan Jones
(74) *Attorney, Agent, or Firm* — Myers Bigel, P.A.

(57) ABSTRACT

A substrate treatment apparatus is provided. The apparatus may include a process chamber configured to have an internal space, a substrate supporting member disposed in the process chamber to support a substrate, a first supplying port configured to supply a supercritical fluid to a region of the internal space located below the substrate, a second supplying port configured to supply a supercritical fluid to other region of the internal space located over the substrate, and an exhaust port configured to exhaust the supercritical fluid from the process chamber to an exterior region.

17 Claims, 6 Drawing Sheets

(56) References Cited

U.S. PATENT DOCUMENTS

| | | | | | |
|---|---|---|---|---|---|
| 2,267,426 | A | * | 12/1941 | Saunders | C09D 7/008 106/287.35 |
| 2,297,614 | A | * | 9/1942 | Fuchs | A47L 15/4427 312/3 |
| 2,414,502 | A | * | 1/1947 | Willcox | G03D 15/022 219/400 |
| 2,690,962 | A | * | 10/1954 | Clarke | B01J 8/44 159/DIG. 3 |
| 2,718,713 | A | * | 9/1955 | Bloxham | F26B 9/06 34/223 |
| 3,474,835 | A | * | 10/1969 | Nicholls | B67C 3/04 141/286 |
| 3,494,601 | A | * | 2/1970 | Behrens | F27B 9/3005 34/201 |
| 3,577,654 | A | * | 5/1971 | Marley | A24B 1/02 34/231 |
| 4,224,918 | A | * | 9/1980 | Tanaka | F02B 23/08 123/188.14 |
| 4,373,658 | A | * | 2/1983 | March | B23K 1/015 134/182 |
| 4,412,388 | A | * | 11/1983 | Takagi | F26B 3/347 118/620 |
| 4,628,616 | A | * | 12/1986 | Shirai | B23K 1/015 134/11 |
| 4,750,276 | A | * | 6/1988 | Smith | A21B 1/245 126/21 A |
| 4,877,587 | A | * | 10/1989 | Rhee | B01J 8/1827 422/135 |
| 5,271,774 | A | * | 12/1993 | Leenaars | H01L 21/67034 134/31 |
| 5,445,073 | A | * | 8/1995 | Gilwood | A23L 1/0135 126/21 A |
| 5,564,458 | A | * | 10/1996 | Roth | B60H 1/00485 137/115.06 |
| 6,067,728 | A | * | 5/2000 | Farmer | H01L 21/67028 134/902 |
| 6,242,165 | B1 | * | 6/2001 | Vaartstra | G03F 7/42 134/1 |
| 6,398,875 | B1 | * | 6/2002 | Cotte | H01L 21/02054 134/10 |
| 6,666,928 | B2 | * | 12/2003 | Worm | H01L 21/67051 134/149 |
| 6,712,081 | B1 | * | 3/2004 | Uehara | B08B 7/0021 134/105 |
| 6,723,291 | B1 | * | 4/2004 | Wu | B01J 8/1827 239/504 |
| 6,953,654 | B2 | * | 10/2005 | Ryza | B08B 7/0021 134/1 |
| 7,000,621 | B1 | * | 2/2006 | Verhaverbeke | B08B 3/12 134/122 R |
| 7,124,764 | B2 | * | 10/2006 | Kin | B08B 7/0021 134/22.1 |
| 7,323,064 | B2 | * | 1/2008 | Basceri | C23C 16/4407 134/1 |
| 7,332,691 | B2 | * | 2/2008 | Choi | H01L 21/67109 118/50.1 |
| 7,648,581 | B2 | | 1/2010 | Moriya | |
| 7,913,702 | B2 | | 3/2011 | Moriya | |
| 7,918,940 | B2 | * | 4/2011 | An | H01L 21/67173 118/719 |
| 8,516,953 | B2 | * | 8/2013 | Fiori | A47J 39/003 126/21 A |
| 8,795,541 | B2 | * | 8/2014 | Cho | B08B 7/0021 216/59 |
| 9,027,576 | B2 | * | 5/2015 | Cho | H01L 21/67051 134/184 |
| 2002/0179114 | A1 | * | 12/2002 | Sakashita | B08B 7/0021 134/3 |
| 2004/0003828 | A1 | * | 1/2004 | Jackson | B08B 7/0021 134/1 |
| 2004/0040584 | A1 | * | 3/2004 | Miya | H01L 21/67017 134/21 |
| 2004/0170413 | A1 | * | 9/2004 | Atkins | F26B 13/10 392/484 |
| 2004/0235299 | A1 | * | 11/2004 | Srivastava | G03F 7/427 438/689 |
| 2005/0005957 | A1 | * | 1/2005 | Yamagata | H01L 21/67051 134/200 |
| 2005/0028927 | A1 | * | 2/2005 | Basceri | C23C 16/4407 156/345.1 |
| 2005/0199263 | A1 | * | 9/2005 | Irie | B08B 7/0021 134/2 |
| 2006/0102287 | A1 | * | 5/2006 | Grant | H01L 21/67103 156/345.51 |
| 2006/0174829 | A1 | * | 8/2006 | An | H01L 21/67173 118/52 |
| 2006/0236557 | A1 | * | 10/2006 | Bousfield | A45D 20/06 34/96 |
| 2007/0022949 | A1 | | 2/2007 | Saito | |
| 2007/0144555 | A1 | * | 6/2007 | Chen | B08B 7/0021 134/1 |
| 2009/0020068 | A1 | * | 1/2009 | Ode | B08B 7/0021 117/12 |
| 2009/0101285 | A1 | * | 4/2009 | Park | H01L 21/6708 156/345.55 |
| 2009/0117740 | A1 | * | 5/2009 | Shih | C25D 5/08 438/692 |
| 2009/0169758 | A1 | * | 7/2009 | Ryu | G03F 7/162 427/427.3 |
| 2009/0325469 | A1 | * | 12/2009 | Koo | B24B 37/30 451/54 |
| 2010/0032097 | A1 | * | 2/2010 | Ohashi | H01L 21/67034 156/345.55 |
| 2010/0101497 | A1 | * | 4/2010 | Izuta | H01L 21/67051 118/730 |
| 2010/0126962 | A1 | * | 5/2010 | Lee | H01L 21/6875 216/58 |
| 2010/0130105 | A1 | * | 5/2010 | Lee | B24B 37/04 451/41 |
| 2010/0200397 | A1 | * | 8/2010 | Kim | C25D 7/12 204/263 |
| 2011/0000507 | A1 | * | 1/2011 | Toshima | H01L 21/02057 134/19 |
| 2011/0200742 | A1 | * | 8/2011 | Ikeda | F26B 5/042 427/101 |
| 2011/0226280 | A1 | * | 9/2011 | Berry | G03F 7/427 134/1.1 |
| 2011/0312189 | A1 | * | 12/2011 | Kim | C23C 16/4583 438/758 |
| 2012/0048304 | A1 | * | 3/2012 | Kitajima | H01L 21/67034 134/30 |
| 2012/0064727 | A1 | * | 3/2012 | Oh | H01L 21/02057 438/745 |
| 2012/0073599 | A1 | * | 3/2012 | Miya | H01L 21/67028 134/4 |
| 2012/0240426 | A1 | * | 9/2012 | Hayashi | H01L 21/02068 34/351 |
| 2013/0019905 | A1 | * | 1/2013 | Ji | F26B 23/028 134/30 |
| 2013/0025155 | A1 | * | 1/2013 | Kim | H01L 21/67028 34/516 |
| 2013/0055584 | A1 | * | 3/2013 | Sato | F26B 3/02 34/417 |
| 2013/0199051 | A1 | * | 8/2013 | Oh | H01L 21/67017 34/79 |
| 2013/0278136 | A1 | * | 10/2013 | Lee | H01J 37/3211 315/34 |
| 2013/0284204 | A1 | * | 10/2013 | Xie | B08B 7/0021 134/1.1 |
| 2014/0116474 | A1 | * | 5/2014 | Lawandy | B08B 7/0021 134/34 |
| 2014/0130367 | A1 | * | 5/2014 | Yonekawa | H01L 21/02052 34/380 |
| 2014/0131261 | A1 | * | 5/2014 | Long | B01D 15/02 210/151 |
| 2014/0144462 | A1 | * | 5/2014 | Verhaverbeke | H01L 21/67034 134/1.2 |

(56) References Cited

U.S. PATENT DOCUMENTS

| | | | | |
|---|---|---|---|---|
| 2014/0262024 A1* | 9/2014 | Cho | ............... | H01L 21/67051 156/345.1 |
| 2014/0290093 A1* | 10/2014 | Jung | ............... | H01L 21/00 34/570 |
| 2014/0291421 A1* | 10/2014 | Kim | ............... | H01L 21/00 239/565 |
| 2014/0360041 A1* | 12/2014 | Jeong | ............... | H01L 21/67017 34/218 |
| 2014/0373881 A1* | 12/2014 | Oh | ............... | H01L 21/68728 134/98.1 |
| 2015/0040419 A1* | 2/2015 | Ishibashi | ............... | F26B 5/08 34/218 |

FOREIGN PATENT DOCUMENTS

| | | |
|---|---|---|
| JP | 2007036109 | 2/2007 |
| JP | 2006147654 | 6/2008 |
| JP | 2008306175 | 12/2008 |
| JP | 2010-093190 | 4/2010 |
| JP | 2010-109087 | 5/2010 |
| JP | 2011-040572 | 2/2011 |

* cited by examiner

APPARATUS AND METHODS FOR TREATING A SUBSTRATE

REFERENCE TO PRIORITY APPLICATION

This application claims priority under 35 U.S.C. §119 to Korean Patent Application No. 10-2011-0130385, filed on Dec. 7, 2011, the disclosure of which is hereby incorporated by reference herein in its entirety.

FIELD

Embodiments of the inventive concepts relate to apparatus and methods for treating a substrate, and more particularly, to apparatus and methods for drying a substrate using supercritical fluid.

BACKGROUND

The fabrication of a semiconductor device includes a cleaning process of removing a pollutant from a substrate or wafer. The cleaning process includes a chemical treatment step of removing a pollutant from a substrate using a chemical material, a rinse step of removing the chemical material from the substrate using a rinse solution, and a drying step of drying the rinse solution from the substrate.

In the drying step, an organic solvent may be supplied to a surface of the substrate to substitute the rinse solution, and then the substrate may be heated. However, in the case that the semiconductor device includes a circuit pattern having a small width, a pattern collapse phenomenon may occur wherein the circuit patterns are damaged or destroyed during the drying step.

SUMMARY

Embodiments of the inventive concepts provide apparatus and methods for drying a substrate effectively.

According to some embodiments of the inventive concept, a substrate drying apparatus may include a process chamber having an internal space, a substrate supporting member disposed in the process chamber to support a substrate, a first supplying port configured to supply a supercritical fluid to a region of the internal space located below the substrate, a second supplying port configured to supply a supercritical fluid to a region of the internal space located above the substrate, and an exhaust port configured to exhaust the supercritical fluid from the process chamber to an exterior region.

According to some other embodiments of the inventive concept, a method of drying a substrate may include: positioning a substrate in a process chamber; supplying a supercritical fluid into a lower internal space of the process chamber positioned below the substrate to increase an internal pressure of the process chamber beyond the atmospheric pressure; and then supplying the supercritical fluid into an upper internal space of the process chamber positioned over the substrate to dry the substrate.

According to some other embodiments of the inventive concept, a substrate drying apparatus may include: a process chamber having an internal space; a substrate supporting member disposed in the internal space of the process chamber, the substrate supporting member configured to receive and support a substrate; a blocking plate disposed in the internal space of the process chamber below the substrate supporting member; a first supplying port; a second supplying port; and an exhaust port. The first supplying port may extend through a bottom wall of the process chamber and be configured to supply a supercritical fluid to a bottom surface of the blocking plate and to a region of the internal space located below the substrate and above a top surface of the blocking plate. The second supplying port may extend through a top wall of the process chamber and be configured to supply a supercritical fluid to a region of the internal space located above the substrate. The exhaust port may extend through the bottom wall of the process chamber and be configured to exhaust the supercritical fluid from the process chamber to an exterior region.

BRIEF DESCRIPTION OF THE DRAWINGS

Exemplary embodiments will be more clearly understood from the following brief description taken in conjunction with the accompanying drawings.

FIG. 1 is a sectional view illustrating a substrate treatment apparatus according to some embodiments of the inventive concept;

FIG. 2 is a sectional view illustrating a process chamber, in a sealed state, of the apparatus of FIG. 1;

FIG. 3 is a plan view illustrating a substrate supporting member of the apparatus of FIG. 1;

FIG. 4 is a diagram schematically illustrating a pressure raising step according to some embodiments of the inventive concept;

FIG. 5 is a diagram schematically illustrating a substrate drying step according to some embodiments of the inventive concept;

FIG. 6 is a diagram schematically illustrating an exhausting step according to some embodiments of the inventive concept;

FIG. 7 is a diagram schematically illustrating an exhausting step according to some other embodiments of the inventive concept;

FIG. 8 is a plan view illustrating a blocking plate according to some other embodiments of the inventive concept;

FIG. 9 is a sectional view illustrating a substrate drying apparatus according to some other embodiments of the inventive concept;

FIG. 10 is a plan view illustrating a substrate supporting member of the apparatus of FIG. 9;

FIG. 11 is sectional view illustrating a process chamber, in an open state, of the apparatus of FIG. 9; and FIG. 12 is a graph showing the relationship between a difference in structure of a blocking plate and the consequential technical effect.

Figure 1:
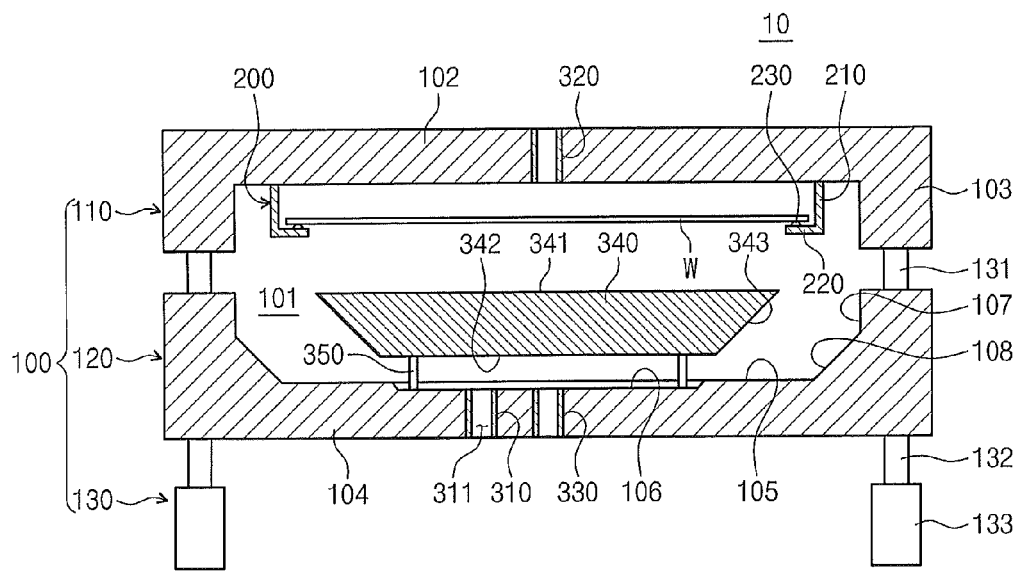
FIGS. 1 through 12 represent non-limiting, exemplary embodiments as described herein.

It should be noted that these figures are intended to illustrate the general characteristics of methods, structure and/or materials utilized in certain exemplary embodiments and to supplement the written description provided below. These drawings are not, however, to scale and may not precisely reflect the precise structural or performance characteristics of any given embodiment, and should not be interpreted as defining or limiting the range of values or properties encompassed by the exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Embodiments of the inventive concepts will now be described more fully with reference to the accompanying drawings, in which exemplary embodiments are shown. Embodiments of the inventive concepts may, however, be embodied in many different forms and should not be construed as being limited to the embodiments set forth herein; rather, these embodiments are provided so that this disclosure will be thorough and complete, and will fully convey the scope of the inventive concepts to those of ordinary skill in the art. In the drawings, the thicknesses of layers and regions may be exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Embodiments of the inventive concepts are described herein with reference to schematic illustrations of exemplary embodiments (and intermediate structures). As such, variations from the shapes of the illustrations as a result, for example, of manufacturing techniques and/or tolerances, are to be expected. Thus, embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to necessarily illustrate the actual shape of a region of a device and are not intended to limit the scope of the inventive concepts.

Unless otherwise defined, all terms (including technical and scientific terms) used herein have the same meaning as commonly understood by one of ordinary skill in the art to which embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
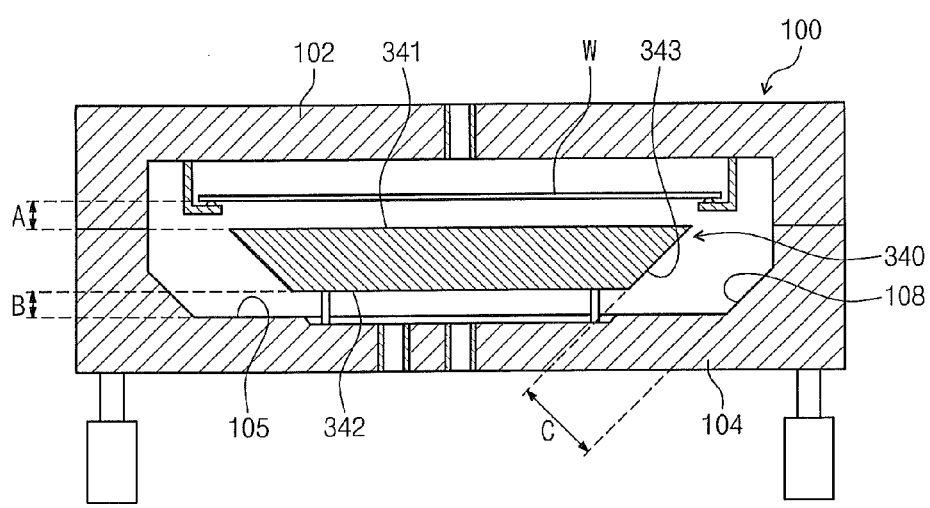

FIG. 1 is a sectional view illustrating a substrate treatment apparatus according to some embodiments of the inventive concept, and FIG. 2 is a sectional view illustrating a process chamber, in a sealed state, of the apparatus of FIG. 1.

Referring to FIGS. 1 and 2, a substrate treatment apparatus 10 may be configured to dry a wafer or substrate W, such as when a rinse process has been finished. In some embodiments, the substrate treatment apparatus 10 may be configured to dry the wafer W using supercritical fluid. The supercritical fluid may be used to dissolve and dry dregs of rinse solution (e.g., organic solvent), which may remain on a surface of the wafer W after the rinse process. In some embodiments, the supercritical fluid may be a carbon dioxide ($CO_2$) in a supercritical state. The carbon dioxide reaches its supercritical state at a temperature of 30° C. or more and a pressure of 7.4 MPa or more. For the sake of simplicity, much of the description that follows will refer to embodiments in which the supercritical fluid is carbon dioxide in a supercritical state.

The substrate treatment apparatus 10 may include a process chamber 100, a substrate supporting member 200, a first supplying port 310, a second supplying port 320, an exhaust port 330, and a blocking plate 340.

The process chamber 100 may define or provide a space in which a drying process on the wafer W is performed. For example, an internal space 101 may be provided in the process chamber 100. The process chamber 100 may be configured to be able to endure temperature and pressure that are higher than a critical temperature and a critical pressure of a supercritical fluid in use. The process chamber 100 may include an upper chamber 110, a lower chamber 120, and a chamber driving part 130.

The upper chamber 110 may be configured to have a space whose bottom is open (i.e., an open bottom portion). In some embodiments, a top wall of the upper chamber 110 may serve as a top wall 102 of the process chamber 100. A sidewall of the upper chamber 110 may be provided as a portion of a sidewall 103 of the process chamber 100.

The lower chamber 120 may be disposed below the upper chamber 110. In some embodiments, the lower chamber 120 may be configured to have a space whose top is open (i.e., an open top portion). The open top portion of the lower chamber 120 may face the open bottom portion of the upper chamber 110. A bottom wall of the lower chamber 120 may serve as a bottom wall 104 of the process chamber 100. A sidewall of the lower chamber 120 may be provided as a portion of the sidewall 103 of the process chamber 100.

The chamber driving part 130 may be configured to move at least one of the upper chamber 110 and the lower chamber 120 vertically. The internal space 101 of the process chamber 100 may be opened or closed by the vertical movement of the upper chamber 110 and/or the lower chamber 120. In some embodiments, the chamber driving part 130 may be configured to open the internal space 101 of the process chamber 100 when the wafer W is loaded to or unloaded from the process chamber 100, and to close the internal space 101 of the process chamber 100 when a drying step on the wafer W is to be performed. In some embodiments, the chamber driving part 130 may be configured to move the lower chamber 120 along a vertical direction (e.g., upwardly and/or downwardly).

The chamber driving part 130 may include a guide rod 131, an elevating rod 132, and a driver 133. The guide rod 131 may be configured to connect a lower portion of the upper chamber 110 with an upper portion of the lower chamber 120, and moreover, to guide the movement of the lower chamber 120 in such a way that the upper portion of the lower chamber 120 and the lower portion of the upper chamber 110 meet to seal the internal space 101 of the process chamber 100. The elevating rod 132 may be provided below a lower portion of the lower chamber 120 and be configured to move upward or downward the lower chamber 120 using a driving force from the driver 133. The driver 133 may be configured to seal the process chamber 100, even when the internal space 101 of the process chamber 100 is in a high pressure state due to the supercritical fluid. In some embodiments, the driver 133 may comprise hydraulic equipment.

A heater (not shown) may be provided, in a buried manner, in at least one of the top wall 102, the sidewall 103, and the bottom wall 104 of the process chamber 100. The process chamber 100 may be heated by the heater, such that the process chamber 100 can be maintained to have a temperature higher than a critical temperature of the supercritical fluid in the process chamber 100.

The bottom wall 104 of the process chamber 100 may be formed to have a recessed portion 106. The recessed portion 106 may be formed to have a predetermined depth. Due to the presence of the recessed portion 106, the process chamber 100 may be formed to have an uneven inner bottom surface 105.

The process chamber 100 may be formed to have an inclined inner side surface 108 (hereinafter, referred to as "inclined surface"). The inclined surface 108 may connect the inner bottom surface 105 of the process chamber 100 with a side surface 107 of the process chamber 100 (e.g., an inner side surface). Due to the presence of the inclined surface 108, a width of the internal space 101 of the process chamber 100 may increase from the inner bottom surface 105 toward the side surface 107. In various embodiments, an angle of the inclined surface 108 may range from about 10° to about 45°.

The substrate supporting member 200 may be provided in the process chamber 100 to support the wafer W. The substrate supporting member 200 may be configured to support a bottom edge portion of the wafer W. For example, a center portion of a bottom surface of the wafer W may be exposed by the substrate supporting member 200. In some embodiments, the substrate supporting member 200 may be vertically spaced apart from the top wall 102 of the process chamber 100.

Figure 3:
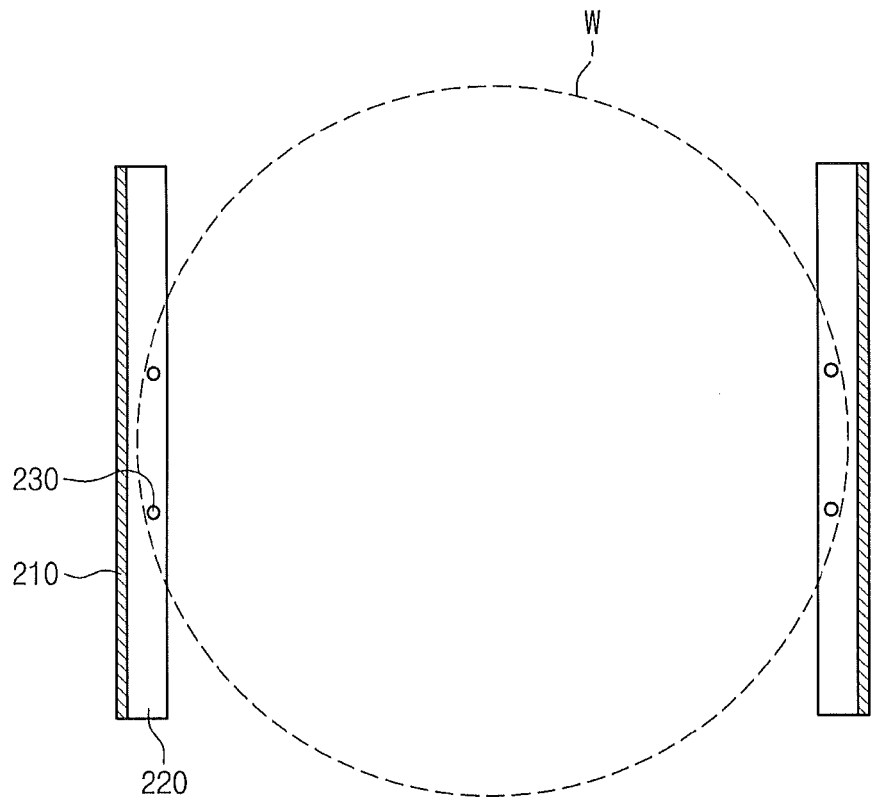

FIG. 3 is a plan view illustrating a substrate supporting member of the apparatus of FIG. 1.

Referring to FIGS. 1 through 3, the substrate supporting member 200 may include at least one vertical rod or member 210 and at least one horizontal rod or member 220. The vertical rod 210 may be perpendicular to and joined to the top wall 102 of the process chamber 100. In some embodiments, the substrate supporting member 200 may include a pair of the vertical rods 210, which may be horizontally spaced apart from each other.

In some embodiments, the substrate supporting member 200 may include a pair of the horizontal rods 220, each of which may be joined to a bottom end portion of the corresponding one of the vertical rods 210. The horizontal rod(s) 220 may be provided in the form of a thin plate or platform and be perpendicular to the vertical rod(s) 210. One or more supporting protrusions 230 may be provided on top surfaces of the horizontal rods 220. The supporting protrusion(s) 230 may protrude from the top surface of the horizontal rod 220. There may be a plurality of the supporting protrusions 230 on each of the horizontal rods 220. The wafer W may be laid on the supporting protrusions 230 and supported by the supporting protrusions 230 at an edge portion thereof.

The supercritical fluid may be supplied into the internal space 101 of the process chamber 100 through the first and second supplying ports 310 and 320. The first supplying port 310 may be formed near a center of the bottom wall 104 of the process chamber 100. A discharging hole 311 of the first supplying port 310 may be formed to penetrate a portion of the bottom wall 104 of the process chamber 100 provided with the recessed portion 106. In some embodiments, the supercritical fluid may be supplied through the first supplying port 310 into a portion of the internal space 101 positioned below the wafer W.

The second supplying port 320 may be provided near a center of the top wall 102 of the process chamber 100. The supercritical fluid may be supplied through the second supplying port 320 into a portion of the internal space 101 positioned above or over the wafer W. The supercritical fluid supplied through the second supplying port 320 may be provided onto a top surface of the wafer W.

The exhaust port 330 may be configured to exhaust a remaining fluid in the process chamber 100 to an external space. The exhaust port 330 may be provided through the bottom wall 104 of the process chamber 100. The exhaust port 330 may be formed adjacent to the first supplying port 310. In some embodiments, a supercritical fluid containing an organic solvent may be expelled or outgassed from the exhaust port 330. The exhaust port 330 may be connected to a regeneration apparatus (not shown), which may be configured to separate the organic solvent from the supercritical fluid, but embodiments of the inventive concepts are not limited thereto.

The blocking plate 340 may be provided below the substrate supporting member 200. In some embodiments, the blocking plate 340 may be provided in a form of a plate. The blocking plate 340 may include a top surface 341, a bottom surface 342, and a side surface 343. The top surface 341 may be parallel to the bottom surface 342. The top surface 341 may have an area greater than that of the bottom surface 342. In the case in which the process chamber 100 is in a closed state, the top surface 341 of the blocking plate 340 may be disposed spaced apart from the bottom surface of the wafer W by a predetermined space A. For example, the space A between the top surface 341 of the blocking plate 340 and the bottom surface of the wafer W may range from about 0.2 cm to about 1.0 cm. The bottom surface 342 may be disposed to face parallel to the inner bottom surface 105 of the process chamber 100. The bottom surface 342 may be spaced apart from the inner bottom surface 105 of the process chamber 100 by a predetermined space B. For example, the space B between the bottom surface 342 and the inner bottom surface 105 of the process chamber 100 may range from about 0.1 cm to about 2 cm. The side surface 343 may be provided to connect the top surface 341 with the bottom surface 342. In some embodiments, the side surface 343 may be inclined in such a way that a sectional area of the blocking plate 340 may increase from the bottom surface 342 upward to the top surface 341. The side surface 343 may be parallel to the inclined surface 108. The side surface 343 may be spaced apart from the inclined surface 108 by a predetermined space C. For example, the space C between the side surface 343 and the inclined surface 108 may range from about 0.1 cm to about 20 cm.

A space between the bottom surface 342 of the blocking plate 340 and the inner bottom surface 105 of the process chamber 100 may be connected to a space between the side surface 343 of the blocking plate 340 and the inclined surface 108 of the process chamber 100, thereby providing a space through which the supercritical fluid supplied through the first supplying port 310 may flow. The supercritical fluid may be supplied onto the bottom surface 342 of the blocking plate 340 and then be moved and diffused into the internal space 101 of the process chamber 100 through a space between the blocking plate 340 and the process chamber 100.

At least one supporting rod or member 350 may be provided below the blocking plate 340 to support the blocking plate 340. For example, a plurality of the supporting rods 350 may be provided spaced apart from each other. A top end portion of each supporting rod 350 may be joined with the blocking plate 340 and a bottom end portion may be laid on the inner bottom surface 105 of the process chamber 100. In some embodiments, the bottom end portions of the supporting rods 350 may be positioned in the recessed portion 106 of the inner bottom surface 105 of the process chamber 100.

Hereinafter, a method of drying a substrate using the afore-described substrate treatment apparatus will be described with reference to the accompanying drawings. According to some embodiments of the inventive concept, a method of drying a substrate may include a pressure boosting or raising step, a drying step, and an exhausting step. In the pressure boosting step, a supercritical fluid may be supplied into the process chamber 100 in such a way that the process chamber 100 can have an internal pressure higher than an atmospheric pressure. In the drying step, the wafer W may be dried using a supercritical fluid supplied onto the top surface thereof under the boosted internal pressure condition. The exhausting step may be performed to exhaust a fluid remaining in the process chamber 100, after the drying step, thereby reducing the internal pressure of the process chamber 100.

Figure 4:
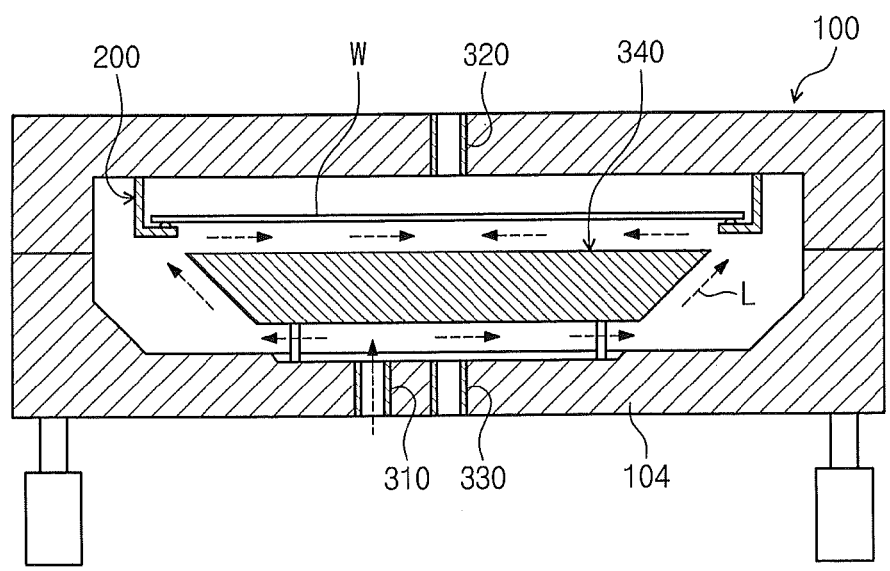

FIG. 4 is a diagram illustrating a pressure raising step according to some embodiments of the inventive concept. Referring to FIG. 4, a supercritical fluid L may be supplied into the process chamber 100 through the first supplying port 310. The supercritical fluid L may be supplied onto the bottom surface 342 of the blocking plate 340 and flow through a space between the blocking plate 340 and the bottom wall 104 of the process chamber 100. The blocking plate 340 may alter the flow of the supercritical fluid L injected through the first supplying port 310. When the supercritical fluid L is directly injected onto a bottom surface of the wafer W, the wafer W may be deformed or depart from its original shape or position by a pressure exerted from the supercritical fluid L. However, the presence of the blocking plate 340 may prevent the supercritical fluid L from being directly supplied onto the wafer W, and thus, the afore-described problems can be prevented.

The supercritical fluid L may be diffused into the process chamber 100 through the space between the blocking plate 340 and the bottom wall 104 of the process chamber 100. The internal pressure of the process chamber 100 may be increased by the supply of the supercritical fluid L. In some embodiments, the supercritical fluid L may be supplied at least until the internal pressure of the process chamber 100 reaches a critical pressure of the supercritical fluid L. If a supercritical fluid is supplied from the second supplying port 320 under the condition that the internal pressure of the process chamber 100 is less than the critical pressure, the supercritical fluid may be liquefied due to the low pressure and may freely fall on the top surface of the wafer W. This may lead to a decay of patterns provided on the wafer W.

The drying step may be performed under the condition that the internal pressure of the process chamber 100 is higher than the critical pressure.

Figure 5:
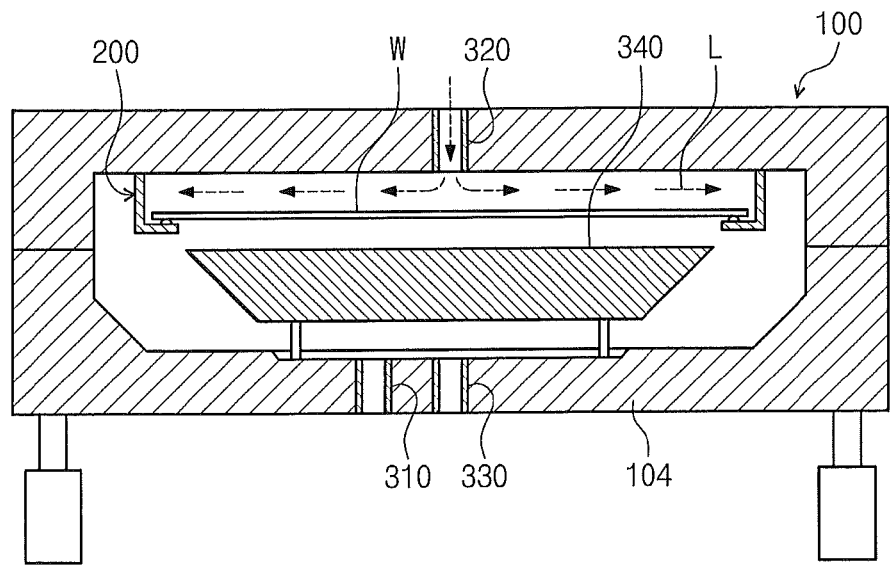

FIG. 5 is a diagram schematically illustrating a substrate drying step according to some embodiments of the inventive concept. Referring to FIG. 5, the supercritical fluid L may be supplied into the process chamber 100 through the second supplying port 320. The supercritical fluid L supplied through the second supplying port 320 may be the same as that supplied through the first supplying port 310. In some embodiments, the supercritical fluid L supplied from the second supplying port 320 may be directly supplied onto the top surface of the wafer W. An organic solvent, which may remain on the top surface of the wafer W, may be dissolved by the supercritical fluid, such that the wafer W can be dried. The supercritical fluid L may be supplied through the second supplying port 320 for a predetermined duration and then be interrupted.

Figure 6:
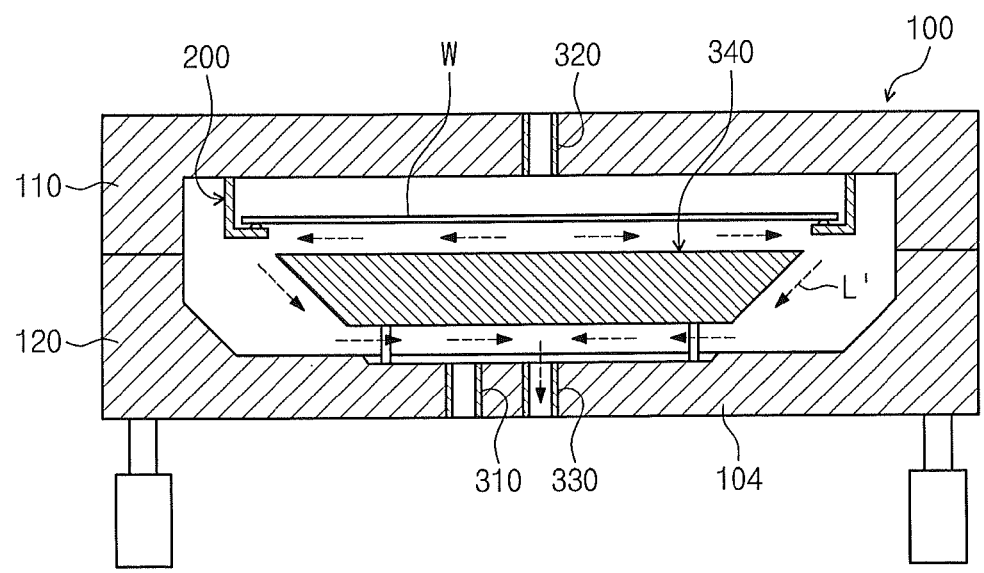

FIG. 6 is a diagram schematically illustrating an exhausting step according to example embodiments of the inventive concept. Referring to FIG. 6, the exhaust port 330 may be configured to exhaust a fluid L' remaining in the process chamber 100 to an exterior of the process chamber 100. The exhaust of the remaining fluid L' may reduce the internal pressure of the process chamber 100. The exhaust of the remaining fluid L' may be performed until the internal pressure of the process chamber 100 reaches the atmospheric pressure. In the case in which the internal pressure of the process chamber 100 is maintained at the atmospheric pressure, the lower chamber 120 may be lowered to open the internal space of the process chamber 100. The wafer W, on which the drying process has finished, may be unloaded, such as by a delivery robot (not shown).

Figure 7:
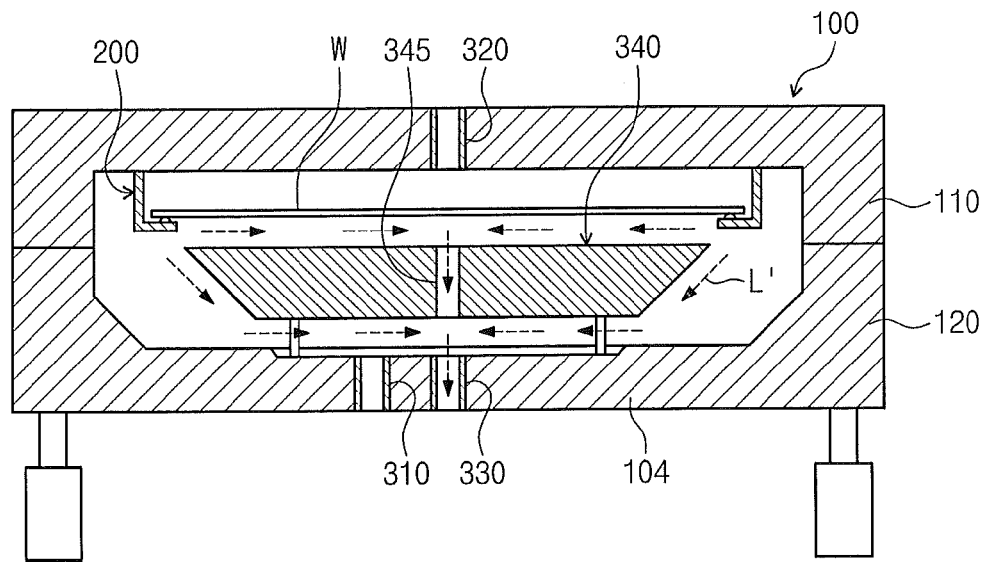

FIG. 7 is a diagram schematically illustrating an exhausting step according to some other embodiments of the inventive concept. Referring to FIG. 7, a first exhaust aperture, hole or passageway 345 may be provided through the blocking plate 340. The first exhaust hole 345 may include a through hole extending from the top surface of the blocking plate 340 to the bottom surface thereof. The first exhaust hole 345 may be formed near a center region of the blocking plate 340. The first exhaust hole 345 may be provided on a vertical axis or line passing through the exhaust port 330. During the drying step, the majority of the fluid L' may stay on the top surface of the blocking plate 340. In the substrate treatment apparatus of FIG. 6, the fluid L' remaining on the blocking plate 340 may be flowed into the exhaust port 330 via a space between the blocking plate 340 and the bottom wall 104 of the process chamber 100. In this case, a path for exhausting the fluid L' may be elongated, and the fluid L' may not be flow smoothly, since a space between the blocking plate 340 and the process chamber 100 may be narrow. However, in the substrate drying apparatus of FIG. 7, the fluid L' remaining on the blocking plate 340 may directly flow into the exhaust port 330 via the first exhaust hole 345. In other words, the path for exhausting the fluid L' can be shortened. Moreover, since the exhaust flowing paths 345 and 330 of the fluid L' may be formed along the same vertical axis or line (i.e., aligned), the fluid L' can more easily flow into the exhaust port 330.

Figure 8:
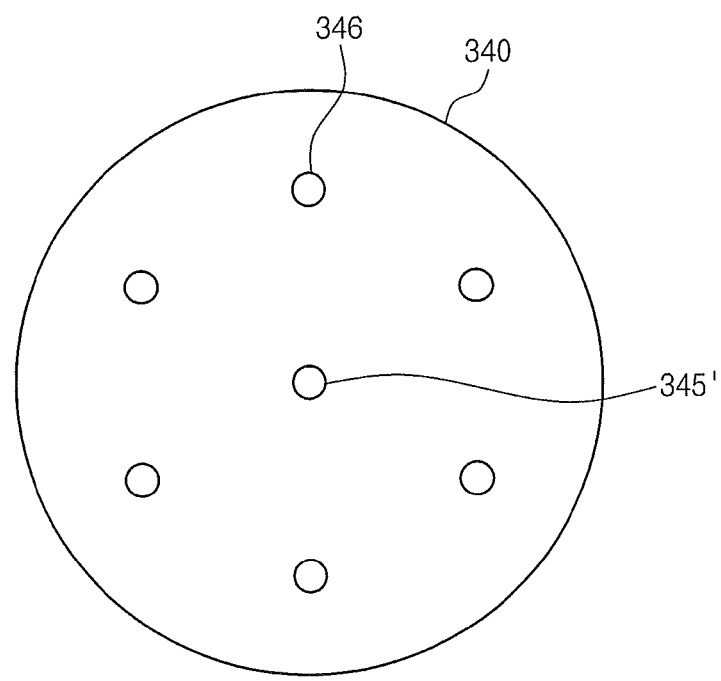

FIG. 8 is a plan view illustrating a blocking plate according to still other embodiments of the inventive concept. Referring to FIG. 8, the blocking plate 340 may be formed to have a first exhaust aperture, hole or passageway 345' and at least one second exhaust aperture, hole or passageway 346. Similar to the first exhaust hole 345 shown in FIG. 7, the first exhaust hole 345' may be provided in a form of a through hole vertically penetrating the blocking plate 340 and be disposed on the same vertical axis or line passing through the exhaust port 330 of FIG. 7. The second exhaust hole 346 may be provided in a form of a through hole vertically penetrating the blocking plate 340. In some embodiments, the blocking plate 340 may include a plurality of the second exhaust holes 346, which may be disposed around the first exhaust hole 345'. A fluid remaining on or above the blocking plate 340 may easily flow through the first and second exhaust holes 345' and 346 to the region positioned below the blocking plate 340.

Figure 9:
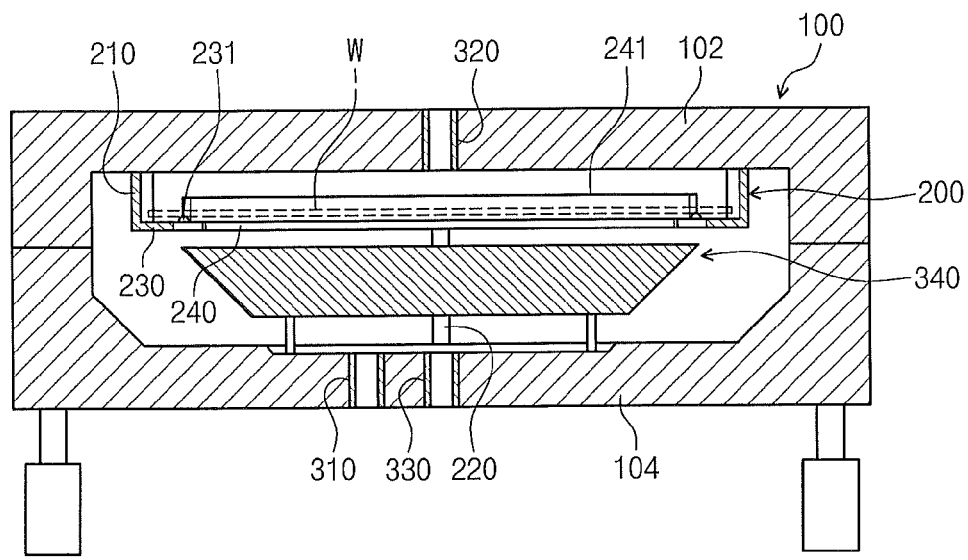
Figure 10:
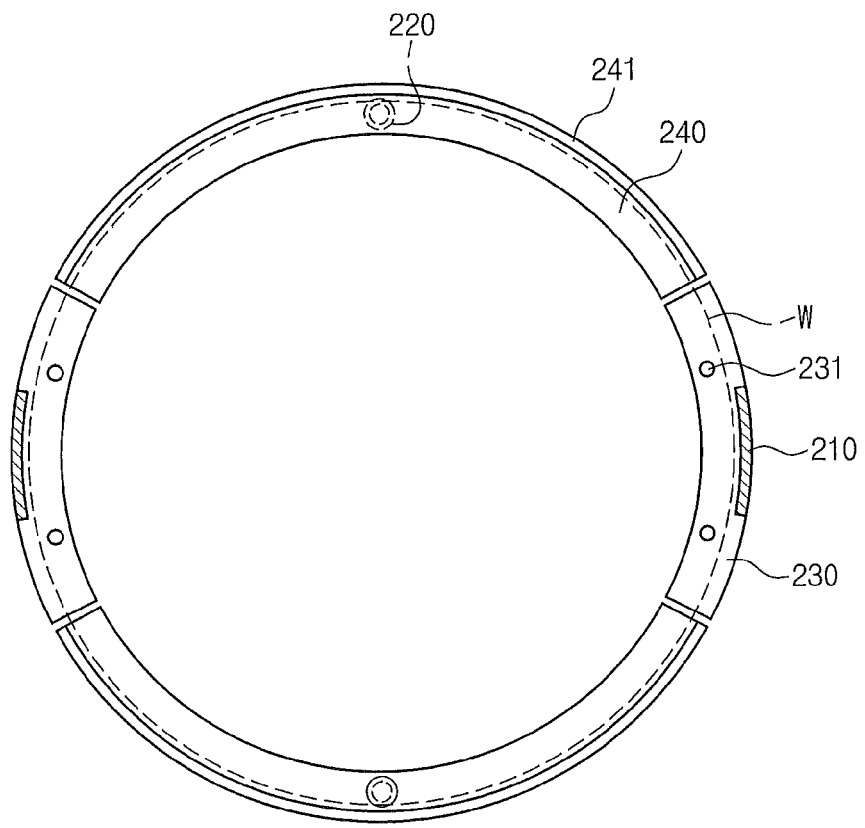

FIG. 9 is a sectional view illustrating a substrate drying apparatus according to some other embodiments of the inventive concept, and FIG. 10 is a plan view of the substrate supporting member shown in FIG. 9.

Referring to FIGS. 9 and 10, the substrate supporting member 200 may include first and second vertical rods or members 210 and 220, and first and second horizontal rods or members 230 and 240. A top end portion of the first vertical rod 210 may be joined to the top wall 102 of the process chamber 100, and a bottom end portion thereof may be spaced apart from the top wall 102 of the process chamber 100 by a predetermined distance. In some embodiments, the substrate supporting member 200 may include a pair of the first vertical rods 210, which may be disposed to face each other. In some embodiments, and as illustrated, the first vertical rods or members 210 may be elongated and/or arcuate.

Each first horizontal rod 230 may be joined to the bottom end portion of a respective first vertical rod 210. Each of the first horizontal rods 230 may be provided in a form of an arc-shaped plate or platform. One or more supporting protrusions 231 may be provided on top surfaces of the first horizontal rods 230. Each of the supporting protrusions 231 may protrude upward from a top surface of the first horizontal rod 230. The wafer W may be loaded on the supporting protrusions 231.

A bottom end portion of each second vertical rod 220 may be joined to the bottom wall 104 of the process chamber 100, and a top end portion thereof may be spaced apart from the top wall 102 of the process chamber 100 by a predetermined distance.

Each second horizontal rod 240 may be joined to top end portion of a respective second vertical rod 220. Each of the second horizontal rods 240 may be provided in a form of an arc-shaped plate or platform. The second horizontal rods 240 may be positioned at the same level as the first horizontal rods 230 when the process chamber 100 is closed. The second horizontal rods 240 may be disposed to form a ring-shaped structure along with the first horizontal rods 230. A guide portion 241 may be provided on a top surface of each second horizontal rod 240. The guide portion 241 may protrude upwardly from the top surface of the second horizontal rod 240 and be positioned outside of the wafer W supported by the supporting protrusion(s) 231. The guide portion 241 may be provided in a form of an arc-shaped, elongated plate and have a length corresponding to that of the second horizontal rod 240. The organic solvent may be provided in a form of fluid having high volatility and low viscosity, and thus, the organic solvent may flow down from the wafer W. In the case in which a surface of the wafer W is dried by using the organic solvent flowing down from the wafer W, the wafer W may be stained or there may be a spatial variation in terms of a dry amount of the wafer W. The vertical rod(s) 210 and the guide portion(s) 241 may be provided to surround bottom and side surfaces of the wafer W, and thus, the organic solvent can be inhibited or even prevented from flowing down from the wafer W. In addition, even before performing a drying step using a supercritical fluid, a portion of the organic solvent may remain on the wafer W, and thus, it is possible to prevent the organic solvent from being naturally dried.

Figure 11:
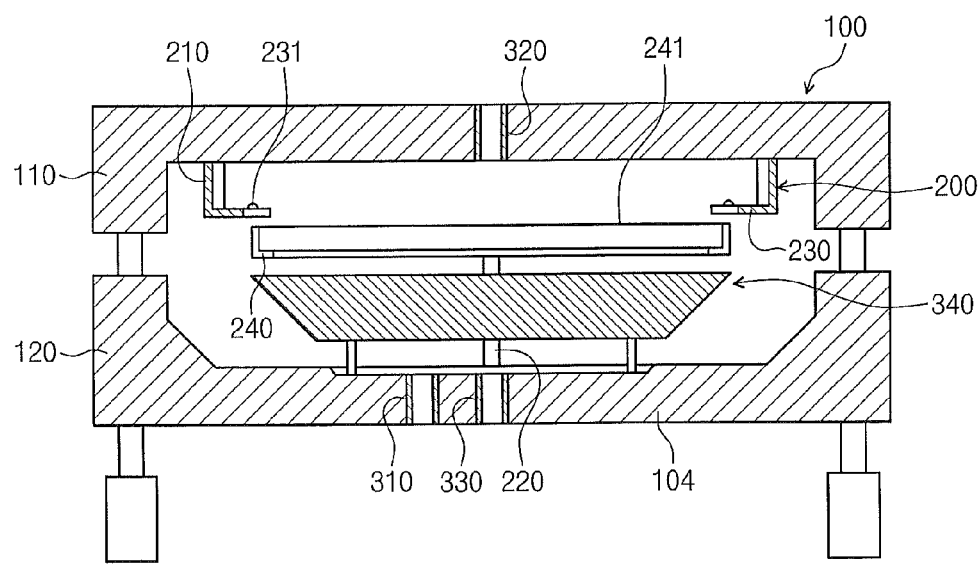

As shown in FIG. 11, in the case in which the lower chamber 120 is lowered to open the internal space of the process chamber 100, the second vertical rod(s) 220 and the second horizontal rod(s) 240 may be lowered along with the lower chamber 120. The wafer W may be loaded into the process chamber 100 such as by laying the wafer W on the supporting protrusions 231. In the case in which the lower chamber 120 is elevated to close the internal space of the process chamber 100, the second vertical rod(s) 220 and the second horizontal rod(s) 240 may be elevated along with the lower chamber 120. The guide portion 241 of the second horizontal rod 240 may then be located at an outside portion of the wafer W.

Figure 12:
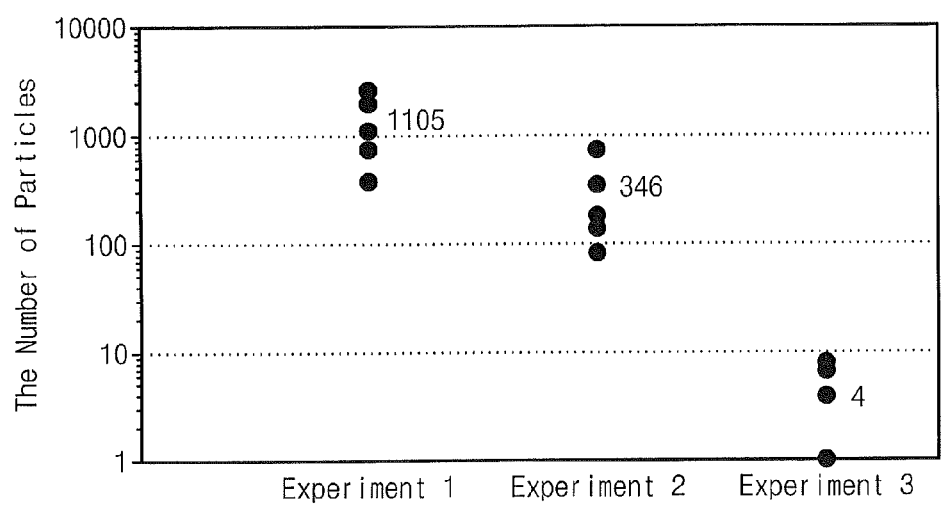

FIG. 12 is a graph showing the relationship between a difference in structure of a blocking plate and the consequential technical effect. The vertical axis of FIG. 12 represents the number of particles produced on surfaces of wafers, and the horizontal axis represents three different experiments.

In the experiment 1, the blocking plate 340 was configured not to have the first exhaust hole 345 of FIG. 7. A space between the top surface 341 of the blocking plate 340 and the bottom surface of the wafer W was 1.5 mm, and a space between the bottom surface 342 of the blocking plate 340 and the inner bottom surface 105 of the process chamber 100 was 3 mm, and a space between the side surface 343 of the blocking plate 340 and the inclined surface 108 of the process chamber 100 was 1.5 mm.

In the experiment 2, the blocking plate 340 was configured to have the first exhaust hole 345 of FIG. 7. The space between the top surface 341 of the blocking plate 340 and the bottom surface of the wafer W, the space between the bottom surface 342 of the blocking plate 340 and the inner bottom surface 105 of the process chamber 100, and the space between the side surface 343 of the blocking plate 340 and the inclined surface 108 of the process chamber 100 were equal to those of the experiment 1.

In the experiment 3, the blocking plate 340 was configured not to have the first exhaust hole 345 of FIG. 7. The space between the top surface 341 of the blocking plate 340 and the bottom surface of the wafer W was 4 mm, the space between the bottom surface 342 of the blocking plate 340 and the inner bottom surface 105 of the process chamber 100 was 3 mm, and the space between the side surface 343 of the blocking plate 340 and the inclined surface 108 of the process chamber 100 was 3 mm.

A comparison of the results of the experiment 2 with those of the experiment 1 indicates that the first exhaust hole 345 of the blocking plate 340 can contribute in reducing the number of particles produced during the drying process. In this sense, it can be understood that the exhaust hole 345 facilitates an exhausting flow of a fluid.

A comparison of the results of the experiment 3 with those of the experiment 1 indicates that the number of particles produced on a wafer decreases with increasing the spaces (between the top surface 341 and the bottom surface of the wafer W, between the bottom surface 342 and the inner bottom surface 105, and between the side surface 343 and the inclined surface 108). In other words, an exhausting flow of a fluid can be facilitated by increasing the spaces. However, if the spaces increase beyond reasonable levels, there may be an accompanying increase in the internal space of the process chamber 100. This means that a process time may increase to increase an internal pressure of the process chamber 100 up to the critical pressure. In other words, the spaces may be designed in light of structural factors affecting the exhausting flow as well as the process time required for increasing the internal pressure of the process chamber 100. For example, the space between the top surface 341 of the blocking plate 340 and the bottom surface of the wafer W may range from 0.2 cm to 1.0 cm, the space between the bottom surface 342 of the blocking plate 340 and the inner bottom surface 105 of the process chamber 100 may range from 0.1 cm to 4 cm, and the space between the side surface 343 of the blocking plate 340 and the inclined surface 108 of the process chamber 100 may range from 0.1 to 20 cm.

The organic solvent in the afore-described example embodiments may include isopropyl alcohol, ethyl glycol, 1-propanol, tetrahydraulic franc, 4-hydroxyl, 4-methyl, 2-pentanone, 1-butanol, 2-butanol, methanol, ethanol, n-propyl alcohol, dimethylether, and so forth.

According to some embodiments of the inventive concept, a supercritical fluid may be used to dissolve a rinse solution, which may remain on a substrate. As a result of the use of the supercritical fluid, the substrate can be effectively dried.

Depending on supplied fluid, a substrate treatment apparatus and method can be used not only drying process, but also another substrate treatment process.

While exemplary embodiments of the inventive concepts have been particularly shown and described, it will be understood by one of ordinary skill in the art that variations in form and detail may be made therein without departing from the spirit and scope of the attached claims.

What is claimed is:

1. A substrate treatment apparatus, comprising:
a process chamber having an internal space and at least one inclined inner side surface;
a substrate supporting member disposed in the process chamber to support a substrate;
a blocking plate disposed in the process chamber below the substrate supporting member, wherein the blocking plate has a bottom surface spaced apart from an internal bottom surface of the process chamber and at least one side surface;
a first supplying port formed through a bottom wall of the process chamber and configured to supply a supercritical fluid to a region of the internal space located below the substrate and to supply the supercritical fluid to the bottom surface of the blocking plate;
a second supplying port configured to supply a supercritical fluid to a region of the internal space located above the substrate; and
an exhaust port configured to exhaust the supercritical fluid from the process chamber to an exterior region,
wherein the at least one side surface of the blocking plate is parallel to the at least one inclined inner side surface of the process chamber.

2. The apparatus of claim 1, wherein the exhaust port is formed through the bottom wall of the process chamber, and wherein the second supplying port is formed through a top wall of the process chamber.

3. The apparatus of claim 1, wherein the substrate supporting member is configured to support a bottom edge portion of the substrate and expose a bottom center portion of the substrate.

4. The apparatus of claim 1, wherein the substrate supporting member comprises:
a pair of spaced apart first vertical members, each first vertical member having a top end portion joined to a top wall of the process chamber; and
a pair of first horizontal members, each one joined to a bottom end portion of a respective first vertical member and having a top surface provided with at least one supporting protrusion on which the substrate is laid.

5. The apparatus of claim 1, wherein the internal bottom surface of the process chamber includes a recessed portion under the blocking plate.

6. The apparatus of claim 5, further comprising a plurality of supporting members provided below the blocking plate to support the blocking plate, the plurality of supporting members disposed within the recessed portion.

7. The apparatus of claim 5, wherein the blocking plate has a first width extending parallel to the internal bottom surface of the process chamber and the recessed portion has a second width extending parallel to the first width, the first width greater than the second width.

8. The apparatus of claim 5, wherein at least one of the first supplying port and the exhaust port penetrates through a bottom wall of the recessed portion.

9. The apparatus of claim 5, wherein the process chamber includes an internal side surface having a vertical side surface and an inclined side surface,
wherein a top of the inclined side surface is at a same level as a portion of the blocking plate, and
wherein a bottom of the inclined side surface is at a same level as a top of the recessed portion of the process chamber.

10. The apparatus of claim 9, wherein the blocking plate includes a the bottom surface facing the internal bottom surface of the process chamber, a top surface facing the substrate, and a side surface facing the internal side surface of the process chamber.

11. The apparatus of claim 10, wherein:
the bottom surface of the blocking plate is spaced apart from the internal bottom surface of the process chamber by a first space ranging from 0.1 cm to 2 cm; and
the top surface of the blocking plate is spaced apart from a bottom surface of the substrate by a second space ranging from 0.2 cm to 1.0 cm.

12. A substrate treating apparatus, comprising:
a process chamber having a top wall, a sidewall and a bottom wall defining an internal space;
a substrate supporting member disposed in the internal space of the process chamber, the substrate supporting member configured to receive and support a substrate;
a blocking plate disposed in the internal space of the process chamber below the substrate supporting member;
a first supplying port extending through the bottom wall of the process chamber and configured to supply a supercritical fluid to a bottom surface of the blocking plate and to a region of the internal space located below the substrate and above a top surface of the blocking plate;
a second supplying port extending through the top wall of the process chamber and configured to supply a supercritical fluid to a region of the internal space located above the substrate; and
an exhaust port extending through the bottom wall of the process chamber and configured to exhaust the supercritical fluid from the process chamber to an exterior region,
wherein the process chamber comprises an upper chamber in which the substrate sporting member is disposed and a lower chamber in which the blocking plate is disposed,
wherein the lower chamber comprises an inner bottom surface having a flat portion on an outer region of the inner bottom surface and a recess on a central region of the inner bottom surface that is adjacent the outer region, with the recess under the blocking plate.

13. The apparatus of claim 12, further comprising a plurality of supporting members provided in the recess to support the blocking plate.

14. The apparatus of claim 12, wherein the blocking plate is spaced apart from the inner bottom surface of the lower chamber and overlaps the recess such that the recess is completely covered by the blocking plate.

15. The apparatus of claim 12, wherein the lower chamber further comprises an inner side surface connected to the inner bottom surface, wherein a boundary between the inner side surface and the inner bottom surface has an inclined surface extending upwardly and away from the inner bottom surface.

16. The apparatus of claim 15, wherein the inclined surface has an angle of 10° to 45° with respect to a vertical line extending from the inner bottom surface.

17. The apparatus of claim 12, wherein the process chamber further comprises a chamber driving part configured to move at least one of the upper and lower chambers such that the process chamber is opened or closed by the vertical movement of at least one of the upper and lower chambers.

* * * * *